US011139447B2

(12) United States Patent
Li

(10) Patent No.: US 11,139,447 B2
(45) Date of Patent: Oct. 5, 2021

(54) LIGHT EMITTING LAYER STRUCTURE AND DISPLAY DEVICE

(71) Applicant: Shenzhen China Star Optoelectronics Semiconductor Display Technology Co., Ltd., Shenzhen (CN)

(72) Inventor: Wenjie Li, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 77 days.

(21) Appl. No.: 16/621,252

(22) PCT Filed: Aug. 29, 2019

(86) PCT No.: PCT/CN2019/103186
§ 371 (c)(1),
(2) Date: Dec. 11, 2019

(87) PCT Pub. No.: WO2020/244072
PCT Pub. Date: Dec. 10, 2020

(65) Prior Publication Data
US 2021/0202884 A1 Jul. 1, 2021

(30) Foreign Application Priority Data

Jun. 3, 2019 (CN) .......................... 201910476162.5

(51) Int. Cl.
*H01L 33/00* (2010.01)
*H01L 21/00* (2006.01)
(Continued)

(52) U.S. Cl.
CPC ...... *H01L 51/5218* (2013.01); *H01L 27/3246* (2013.01); *H01L 27/3283* (2013.01);
(Continued)

(58) Field of Classification Search
CPC ........................... H01L 51/5218; H01L 33/60
(Continued)

(56) References Cited

U.S. PATENT DOCUMENTS 7,116,045 B2 * 10/2006 Karasawa ........... H01L 51/5281
313/501
7,923,920 B2 * 4/2011 Nakamura .......... H01L 51/5271
313/504
(Continued)

FOREIGN PATENT DOCUMENTS

CN 103972262 8/2014
CN 108198842 6/2018
(Continued)

*Primary Examiner* — Calvin Lee

(57) ABSTRACT

The present invention provides a light emitting layer structure and a display device, the light emitting layer structure includes a first charge injection layer disposed on the substrate and located in the pixel opening region; a metal reflective layer disposed on the first charge injection layer; the beneficial effects of the present invention is that in the light-emitting layer structure and display device of the present invention, the lengthwise direction of the metal reflective layer is longer than the lengthwise direction of the pixel opening region, can perform secondary irradiation to decompose the organic impurities remaining at the short arc-shape side and improve spreadability of the ink.

9 Claims, 2 Drawing Sheets

(51) Int. Cl.
    *H01L 51/52*       (2006.01)
    *H01L 27/32*       (2006.01)
    *H01L 33/10*       (2010.01)
    *H01L 33/60*       (2010.01)
    *H01L 51/50*       (2006.01)

(52) U.S. Cl.
    CPC .............. *H01L 33/10* (2013.01); *H01L 33/60* (2013.01); *H01L 51/5088* (2013.01); *H01L 51/5209* (2013.01)

(58) Field of Classification Search
    USPC ....................................... 438/29, 69; 257/98
    See application file for complete search history.

(56) References Cited

U.S. PATENT DOCUMENTS

| | | | |
|---|---|---|---|
| 7,952,105 B2* | 5/2011 | Cok | H05B 33/28 |
| | | | 257/79 |
| 8,414,983 B2* | 4/2013 | Parri | B42D 25/364 |
| | | | 427/535 |
| 10,964,890 B2* | 3/2021 | Pschenitzka | H01L 51/0023 |
| 2013/0087770 A1 | 4/2013 | Son et al. | |
| 2019/0207130 A1 | 7/2019 | He et al. | |

FOREIGN PATENT DOCUMENTS

| | | |
|---|---|---|
| CN | 108987450 | 12/2018 |
| CN | 109256413 | 1/2019 |

\* cited by examiner

LIGHT EMITTING LAYER STRUCTURE AND DISPLAY DEVICE

RELATED APPLICATIONS

This application is a National Phase of PCT Patent Application No. PCT/CN2019/103186 having International filing date of Aug. 29, 2019, which claims the benefit of priority of Chinese Patent Application No. 201910476162.5 filed on Jun. 3, 2019. The contents of the above applications are all incorporated by reference as if fully set forth herein in their entirety.

FIELD AND BACKGROUND OF THE INVENTION

The present invention relates to the field of display technologies, and more particularly to a light emitting layer structure and a display device.

Organic light emitting diodes (OLEDs) have been widely used due to their advantages of good self-luminous properties, high contrast, fast response times, and flexible display. Conventional OLEDs use vacuum evaporation technology and are currently mass-produced. However, this technology requires using a fine reticle, resulting in low material utilization. In addition, performing the mask preparation process of large-sized panels encounters many challenges. In recent years, printing display technology, such as ink jet printing (IJP), has developed rapidly. Printing display technology is the best way for OLED devices to achieve large size and low-cost production.

Using a printed display technology to perform preparation process of an OLED requires to modify a pixel defining layer (bank) and a substrate electrode, so that the ink can accurately fall within the pixel without overflow. Therefore, one of the key technologies of IJP is to make the surface of the pixel defining layer have basic hydrophobicity, and the ink can be confined within the pixel defining layer. The pixel defining layer may use an organic photoresist, wherein component of the photoresist includes a water receiving functional group or the like.

Surface of the pixel definition layer of the substrate used in the IJP OLED has hydrophobicity, and a patterned pixel defining layer is prepared by using an organic photoresist containing a hydrophobic component. The main preparation process includes exposure and development process, in the exposure process, there will be shadow effects and may have some photoresist residue on the surface of the transparent conductive film. In the development process, the photoresist that does not react is dissolved in the developer and washed away, and if not sufficiently cleaned, a trace amount of impurities adheres to the surface of the transparent conductive film. The impurities remaining on the surface of the transparent conductive film may cause poor spread of the ink, so that leakage current or the like may occur in the device, and the device characteristics may be deteriorated.

SUMMARY OF THE INVENTION

In order to solve the above problems, the present invention provides a light emitting layer structure and a display device for solving the problem that residual photoresist remaining on the surface of a transparent conductive film during exposure and development process of a pixel defining layer in the prior art, thereby making the subsequent ink cannot be tiled on the surface of the transparent conductive film, causing leakage current in the device.

The technical solution to solve the above problems: a light emitting layer structure, including a substrate, a pixel defining layer disposed on the substrate, the pixel defining layer having a pixel opening region, and a reflective electrode, including: a first charge injection layer disposed on the substrate and located in the pixel opening region, wherein the first charge injection layer is a transparent structure; a metal reflective layer disposed on the first charge injection layer; and a second charge injection layer disposed on the metal reflective layer and partially exposed to the pixel opening region, wherein the second charge injection layer is a transparent structure.

Further, pixel opening region is in an oval shape, each of opposite sides of the pixel opening region in a lengthwise direction of the pixel opening region having an arc-shape; and the metal reflective layer is in an oval shape each of opposite sides of the metal reflective layer in a lengthwise direction of the metal reflective layer having an arc-shape, wherein each of the opposite sides of the metal reflective layer extends from an edge of the arc-shape of the pixel opening region to outside the pixel opening region, and in a direction perpendicular to the length of the pixel opening region, that is in a widthwise direction, the opposite sides of the metal reflective layer located in the pixel opening region and spaced apart from the pixel opening region by a distance.

Further, a projection of the second charge injection layer on the substrate is completely coincides with a projection of the first charge injection layer on the substrate.

Further, a distance of the widthwise direction of the metal reflective layer is 50% to 99% of a distance of a widthwise direction of the pixel opening region.

Further, each of a thickness of the first charge injection layer and a thickness of the second charge injection layer ranges between 10 nm to 1000 nm; and material of each of the first charge injection layer and the second charge injection layer is transparent indium tin oxide.

Further, a projection of the pixel opening region on the substrate completely falls within a projection of the first charge injection layer on the substrate.

Further, material of the pixel defining layer is an organic photoresist having hydrophobicity.

Further, material of the metal reflective layer is an alloy or a metal oxide of Al, Ag, or Mg.

The light emitting layer structure and the display device of the present invention are provided with a metal reflective layer disposed under the second charge injection layer of the pixel opening region, wherein the lengthwise direction of the metal reflective layer is longer than the lengthwise direction of the pixel opening region, thereby when performing subsequent ultraviolet irradiation process, the secondary irradiation may perform at the end of the lengthwise direction, that is, the short arc-shape side of the pixel opening region, to decomposing the organic residue on the second charge injection layer at the short arc-shape side to improve spreadability of the ink. The width of the metal reflective layer perpendicular to the lengthwise direction of the metal reflective layer is smaller than the width of the pixel opening region. In the ultraviolet irradiation process, the long side of the pixel opening region only be irradiated one time, so that the hydrophobicity of the surface of the pixel defining layer is not greatly reduced, and the ink overflow phenomenon is not caused.

BRIEF DESCRIPTION OF THE SEVERAL VIEWS OF THE DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from those skilled in the art based on these drawings without paying any creative effort.

DESCRIPTION OF SPECIFIC EMBODIMENTS OF THE INVENTION

Figure 1:
FIG. 1 shows a side cross-sectional view in a lengthwise direction of a pixel opening region of a light emitting layer structure according an embodiment.

The preferred embodiments of the present invention will be described with reference to the accompanying drawings, which are to be construed as illustrative embodiments of the invention. The present invention can be embodied in many different forms of the embodiments of the invention, and the scope of the invention is not limited to the embodiments described herein.

In the drawings, structurally identical components are denoted by the same reference numerals, and structural or functionally similar components are denoted by like reference numerals. The dimensions and thickness of each component shown in the drawings are arbitrarily shown, and the invention does not limit the size and thickness of each component. In order to make the illustration clearer, some parts of the drawing appropriately exaggerate the thickness of the components.

In addition, the following description of the various embodiments of the invention is intended to be illustrative of the specific embodiments of the invention. Directional terms mentioned in the present invention, for example, "upper", "lower", "front", "back", "left", "right", "inside", "outside", "side", etc., only use for describe and understand the invention in a better and clearer manner, and does not indicate or imply that the device or component referred to must have a particular orientation, construction and operation. Moreover, the terms "first", "second", "third", and the like are used for descriptive purposes only and are not to be construed as indicating or implying relative importance.

When a component is described as being "on" another component, the component can be placed directly on the other component, or an intermediate component can also be present, the component being placed on the intermediate component, and the intermediate part is placed on another component. When a component is described as "mounted to" or "connected to" another component, both can be understood as "directly" or "connected", or a component is "mounted to" or "connected to" through an intermediate component to another component.

EMBODIMENTS

Figure 2:
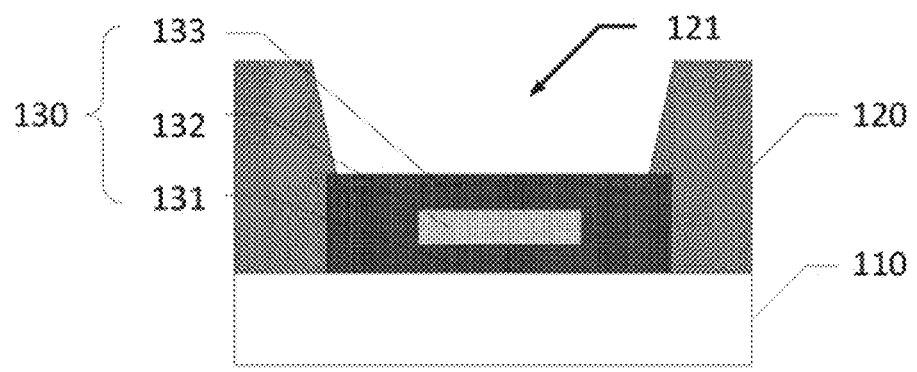
FIG. 2 shows a side cross-sectional view in a short direction of the pixel opening region of the light emitting layer structure according an embodiment.

As shown in FIG. 1 and FIG. 2, in the present embodiment, the light emitting layer structure 10 of the present invention includes a substrate 110, a pixel defining layer 120, and a reflective electrode 130; wherein the reflective electrode 130 includes a first charge injection layer 131, a metal reflective layer 132 and a second charge injection layer 133.

The substrate 110 is a hard glass substrate for carrying the pixel defining layer 120.

The pixel defining layer 120 is disposed on the substrate 110, the surface of the pixel defining layer 120 has hydrophobicity, and is patterned by using an organic photoresist having an organic hydrophobic component such as F or CI, preferably, patterning a negative definition photoresist to form the pixel defining layer 120.

The pixel defining layer 120 has a plurality of pixel opening regions 121, and the pixel opening regions 121 has an oblong shape in a top view, specifically, the pixel opening region 121 includes two long sides 1211 parallel to each other and two arc-shaped sides 1212. Each of arc-shaped side 1212 connect the two first long sides 1211, wherein the arc-shaped side 1212 is a short arc-shape side.

The reflective electrode 130 is disposed between the substrate 110 and the pixel defining layer 120. Specifically, the reflective electrode 130 corresponds to the pixel opening region 121, and the reflective electrode 130 can be formed by performing thermal evaporation or sputtering process.

The reflective electrode 130 includes a second charge injection layer 133 disposed on the substrate 110 and located in the pixel opening region 121. The second charge injection layer 133 is a transparent structure and is made of indium tin oxide or indium zinc oxide, and a thickness of the second charge injection layer 133 ranges between 10 nm to 1000 nm.

Since the pixel opening region 121 has an oblong shape in the top view, the arc-shaped side 1212 is a short arc-shape side, and in the subsequent inkjet printing technology process, the surface of the second charge injection layer 133 at the short arc-shape side is easy to leave trace amount of impurities, which affects the spreading effect of the ink.

In the prior art, the pixel opening region 121 is generally irradiated with ultraviolet ray to remove the photoresist residue on the second charge injection layer 133, but the ultraviolet light irradiation may reduce the hydrophobicity of the pixel defining layer 120. The hydrophobicity has a relatively much influence on the short arc-shape side of the pixel opening region 121. In the present embodiment, the metal reflective layer 132 is disposed under the second charge injection layer 133, due to the metal reflective layer 132 has a reflecting light effect, and can perform secondary reflection when irradiated with ultraviolet ray, therefore sufficiently decomposes the organic impurities on the second charge injection layer 133.

A thickness of the metal reflective layer 132 is in a range between 50 nm to 1000 nm, wherein material of the metal reflective layer is an alloy or a metal oxide of Al, Ag or Mg or the remaining metal which can reflect ultraviolet ray, and can be formed by performing a fine mask or etching process.

Figure 3:
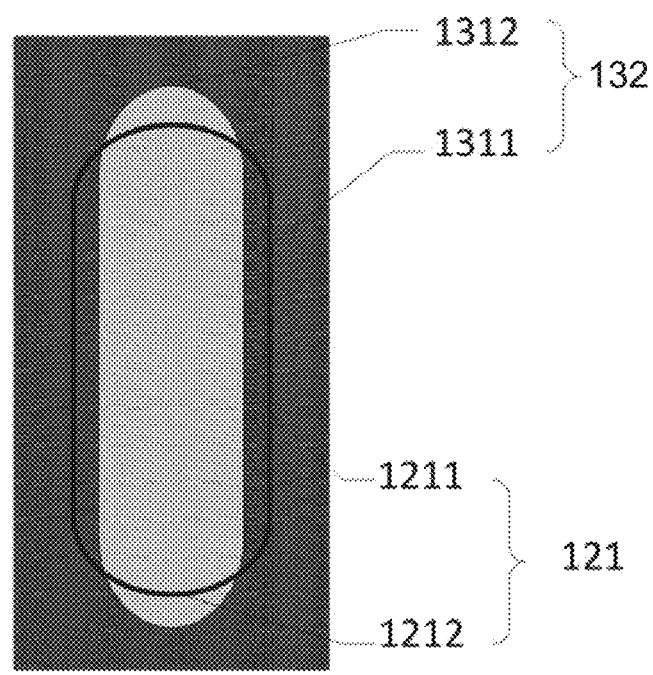
FIG. 3 shows a partial plan view of an illuminating layer mechanism according an embodiment.

As shown in FIG. 3, the shape of the metal reflective layer 132 is similar to the shape of the pixel opening region 121, and has an oblong shape in the top view. The metal reflective layer 132 includes two long sides 1311 parallel to each other and two arc-shaped side 1312. Each of the arc-shaped side 1312 connecting the two long sides 1311, wherein the arc-shaped side 1312 is a short arc-shaped side. The metal reflective layer 132 is different from the pixel opening region 121 in that the arc-shaped side 1312 of the metal reflective layer 132 extends beyond the arc-shaped side 1212 of the pixel opening region 121. When the ultraviolet light is irradiated, the light is reflected back through the metal reflective layer 132, and the second charge injection layer 133 opposite to the arc-shaped side 1212 is twice irradiated to fully decompose the organic impurities on the surface; another difference is that in the direction perpendicular to the lengthwise direction of the pixel opening region 121, that is, the widthwise direction, the two second long sides 1311 of the metal reflective layer 132 are both positioned in the pixel opening region 121 and spaced apart from the two long sides 1211 of the pixel opening region 121. When the ultraviolet irradiation is performed, the second charge injection layer 133 in the direction of the first long side 1211 is only subjected to ultraviolet irradiation once, and the surface hydrophobicity is not affected; a distance between the two long sides 1311 is 50% to 99% of a distance of a distance between the two long sides 1211.

In order to prevent the cross section of the metal reflective layer 132 from being exposed in a subsequent process, the first charge injection layer 131 of the present invention is disposed on the substrate 110 and below the metal reflective layer 132, and has a thickness ranges between 10 nm to 1000 nm, the shape coincides with the second charge injection layer 133. Both of them are larger than the pixel opening region 121, and it can be ensured that the ink is completely spread on the second charge injection layer 133 in the subsequent inkjet printing process.

Figure 4:
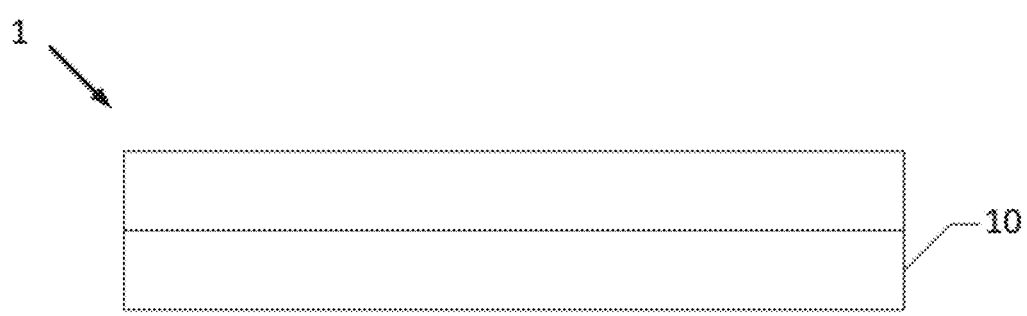
FIG. 4 shows a schematic view of a display device according an embodiment.

As shown in FIG. 4, the present invention further provides a display device 1, the main improvement points and features are concentrated on the light emitting layer structure 10, and other components of the display device will not be described again.

The above are only preferred embodiments of the present invention, and it should be noted that those skilled in the art can also make several improvements and refinements without departing from the principles of the present invention. These improvements and refinements should also be considered in a protected range of the present invention.

What is claimed is:

1. A light emitting layer structure, comprising:
    a substrate;
    a pixel defining layer disposed on the substrate, the pixel defining layer having a pixel opening region, wherein the pixel opening region has an oblong shape in a top view and opposite sides in a lengthwise direction of the pixel opening region are arc-shaped; and
    a reflective electrode, comprising:
    a first charge injection layer disposed on the substrate and located in the pixel opening region, wherein the first charge injection layer is a transparent structure;
    a metal reflective layer disposed on the first charge injection layer, wherein the metal reflective layer has an oblong shape in the top view and opposite sides in the lengthwise direction of the metal reflective layer are arc-shaped; and
    a second charge injection layer disposed on the metal reflective layer and partially exposed to the pixel opening region, wherein the second charge injection layer is a transparent structure;
    wherein each of the opposite sides of the metal reflective layer in the lengthwise direction extends from an edge of each of the opposite sides of the pixel opening region to outside the pixel opening region, and
    wherein each of opposite long sides of the metal reflective layer in a widthwise direction is positioned in the pixel opening region, and is spaced apart from long sides of the pixel opening region by a distance.

2. The light emitting layer structure according to claim 1, wherein
    each of a thickness of the first charge injection layer and a thickness of the second charge injection layer ranges between 10 nm to 1000 nm; and
    material of each of the first charge injection layer and the second charge injection layer is transparent indium tin oxide.

3. The light emitting layer structure according to claim 1, wherein a distance between opposite long sides of the metal reflective layer is 50% to 99% of a distance between opposite long sides of the pixel opening region.

4. The light emitting layer structure according to claim 1, wherein
    a projection of the second charge injection layer on the substrate completely coincides with a projection of the first charge injection layer on the substrate.

5. The light emitting layer structure according to claim 1, wherein a projection of the pixel opening region on the substrate completely falls within a projection of the first charge injection layer on the substrate.

6. The light emitting layer structure according to claim 1, wherein material of the pixel defining layer is an organic photoresist having hydrophobicity.

7. The light emitting layer structure according to claim 1, wherein material of the metal reflective layer is an alloy or a metal oxide of Al, Ag, or Mg.

8. The light emitting layer structure according to claim 1, wherein a thickness of the metal reflective layer is in a range between 50 nm to 1000 nm.

9. A display device comprising the light emitting layer structure as claimed in claim 1.

* * * * *